(12) United States Patent
Kozicki

(10) Patent No.: US 7,294,875 B2
(45) Date of Patent: Nov. 13, 2007

(54) NANOSCALE PROGRAMMABLE STRUCTURES AND METHODS OF FORMING AND USING SAME

(75) Inventor: Michael N. Kozicki, Phoenix, AZ (US)

(73) Assignee: Axon Technologies Corporation, Scottsdale, AZ (US)

(*) Notice: Subject to any disclaimer, the term of this patent is extended or adjusted under 35 U.S.C. 154(b) by 119 days.

(21) Appl. No.: 11/151,904

(22) Filed: Jun. 14, 2005

(65) Prior Publication Data

US 2005/0274942 A1 Dec. 15, 2005

Related U.S. Application Data

(63) Continuation-in-part of application No. 10/458,551, filed on Jun. 9, 2003.

(60) Provisional application No. 60/579,540, filed on Jun. 14, 2004, provisional application No. 60/390,793, filed on Jun. 19, 2002, provisional application No. 60/387,204, filed on Jun. 7, 2002.

(51) Int. Cl.
*H01L 27/148* (2006.01)

(52) U.S. Cl. ............ 257/243; 257/350; 257/359; 257/379; 257/536; 257/E21.35; 977/810; 977/831; 977/943; 365/148

(58) Field of Classification Search .......... None
See application file for complete search history.

(56) References Cited

U.S. PATENT DOCUMENTS

| 6,528,816 B1 | 3/2003 | Jackson et al. | |
|---|---|---|---|
| 7,022,579 B2 * | 4/2006 | Li et al. | 438/384 |
| 2002/0117599 A1 | 8/2002 | Domeier et al. | |
| 2002/0168820 A1 | 11/2002 | Kozicki et al. | |
| 2005/0101084 A1 * | 5/2005 | Gilton | 438/232 |

* cited by examiner

*Primary Examiner*—Sue A. Purvis
*Assistant Examiner*—Scott R Wilson
(74) *Attorney, Agent, or Firm*—Snell & Wilmer L.L.P.

(57) ABSTRACT

A programmable structure and device and methods of forming and using the structure and device are disclosed. The structure includes a soluble electrode, an ion conductor, and an inert electrode. Upon application of a sufficient voltage, a conductive region forms within or on the ion conductor and between the electrodes. The presence or absence of the conductive region can be used to store information in memory devices.

13 Claims, 10 Drawing Sheets

NANOSCALE PROGRAMMABLE STRUCTURES AND METHODS OF FORMING AND USING SAME

CROSS REFERENCE TO RELATED APPLICATIONS

This application is a continuation-in-part of and claims priority to, and the benefit of, U.S. patent application Ser. No. 10/458,551 entitled SCALABLE PROGRAMMABLE STRUCTURE, AN ARRAY INCLUDING THE STRUCTURE, AND METHODS OF FORMING THE SAME, filed Jun. 9, 2003, which claims the benefit of U.S. Provisional Application Ser. No. 60/387,204, entitled PROGRAMMABLE METALLIZATION CELL WITH INTEGRAL SERIES DIODE, filed Jun. 7, 2002 and U.S. Provisional Application Ser. No. 60/390,793, entitled MICROELECTRONIC DEVICE, STRUCTURE, AND SYSTEM, INCLUDING A MEMORY STRUCTURE HAVING A VARIABLE PROGRAMMABLE PROPERTY AND METHOD OF FORMING THE SAME, filed Jun. 19, 2002. This application also claims priority to Provisional Application Ser. No. 60/579,540, entitled NANOSCALE MEMORY ELEMENTS BASED ON SOLID-STATE ELECTROLYTES, filed Jun. 14, 2004. All four applications are hereby incorporated by reference in their entirety.

FIELD OF INVENTION

The present invention generally relates to programmable structures, to devices including the structures, and to methods of forming and programming the structures. More particularly, the invention relates to nanoscale programmable structures having an electrical property that can be altered by manipulating an amount of energy supplied to the structure and to the methods of forming and programming the structures.

BACKGROUND OF THE INVENTION

Programmable structures such as semiconductor-based memory elements are often used in electronic systems to store information. For example, typical DRAM, SRAM, FLASH and similar memory structures are often used to store information in electronic systems such as computers, personal digital assistants, and the like.

Semiconductor-based programmable memory devices generally require a crystalline substrate as a starting material. Consequently, when such memory devices are integrated with other microelectronic devices that also require a crystalline substrate, the two devices are often formed on separate substrates.

Forming memory devices and other devices on separate substrates may be undesirable for several reasons. For example, forming various types of memory on separate substrate may be relatively expensive, may require relatively long transmission paths to communicate between the memory devices and any associated electronic device, and may require a relatively large amount of room within a system. Accordingly, memory structures that do not require crystalline substrates are desirable.

Furthermore, as the semiconductor and microelectronics industries continue down the roadmap of ever decreasing the size of memory devices, several problems with existing memory technologies arise. For example, as the physical size of charge-storage devices such as FLASH and DRAM devices decreases, state detection and/or retention of the devices deteriorate. With other typical semiconductor memory devices, power consumption and cost of the devices generally increase as the size of the devices decreases. Accordingly, improved memory devices, which are scalable to relatively small sizes, which consume relatively little power, and which are relatively inexpensive to manufacture are desired.

SUMMARY OF THE INVENTION

The present invention provides improved programmable structures, devices including the structures, and methods of forming and using the structures and devices. The structures and devices of various embodiments of the invention can be used in electronic systems and can replace traditional memory devices such as FLASH, DRAM, SRAM, and the like typically found in such systems.

While the ways in which the present invention addresses the various drawbacks of typical programmable memory devices will be discussed in greater detail below, in general, the devices and structures of the present invention are relatively easy to manufacture, are relatively inexpensive, consume relatively small amounts of power, and can be scaled down to relatively small sizes.

In accordance with various embodiments of the invention, a programmable structure includes an ion conductor and at least two electrodes proximate the ion conductor. An electrical property of the structure is altered by supplying a sufficient voltage across the electrodes to form a conductive region within the ion conductor. The presence or absence of the conductive region can be detected using appropriate circuitry, and thus the programmable structures can be used to store non-volatile information.

In accordance with one embodiment of the invention, the ion conductor is formed within a via having a cross section less than 200 nm and preferably less than about 100 nm.

In accordance with another embodiment of the invention, a device includes a programmable structure including an ion conductor, at least two electrodes proximate the ion conductor, and an electron-sensitive resist material surrounding at least a portion of the programmable structure.

In accordance with another embodiment of the invention, the programmable structures are programmed using low-energy power, such that the structures can be used in DRAM applications.

In accordance with yet another embodiment of the invention, a structure is programmed using a sufficient voltage and current to mitigate any drift in the device.

In accordance with yet a further embodiment of the invention, a threshold voltage of a structure is altered by altering an amount of conductive material within an ion conductor of a programmable structure.

In accordance with yet a further embodiment of the invention, a method of forming a programmable structure includes providing a substrate, depositing a first electrode material onto the substrate, depositing a resist material onto the first electrode material, patterning the resist material to form vias within the resist material, depositing ion conductor material into the vias, and depositing a second electrode material overlying the ion conductor material. In accordance with one aspect of this embodiment, the resist material is patterned using electron-beam techniques. In accordance with another aspect, the resist is patterned using nanoimprint lithography. In accordance with various additional aspects of this embodiment, conductive material is added to the ion conductor using thermal and/or photo dissolution techniques.

In accordance with yet another embodiment of the invention, a method of forming a programmable structure includes providing a substrate, depositing a first electrode material onto the substrate, depositing an insulating material onto the first electrode material, patterning the insulating material to form vias having a width of less than about 200 nm, depositing ion conductor material into the vias, and depositing a second electrode material overlying the ion conductor material. In accordance with various aspects of this embodiment, conductive material is added to the ion conductor using thermal and/or photo dissolution techniques.

In accordance with another embodiment of the invention, a method of forming a programmable structure includes providing a substrate, depositing a first electrode material onto the substrate, depositing a resist material onto the first electrode material, patterning the resist material to form vias within the resist material, depositing ion conductor material into the vias using a slow deposition process, and depositing a second electrode material overlying the ion conductor material. In accordance with various aspects of this embodiment, conductive material is added to the ion conductor using thermal and/or photo dissolution techniques.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
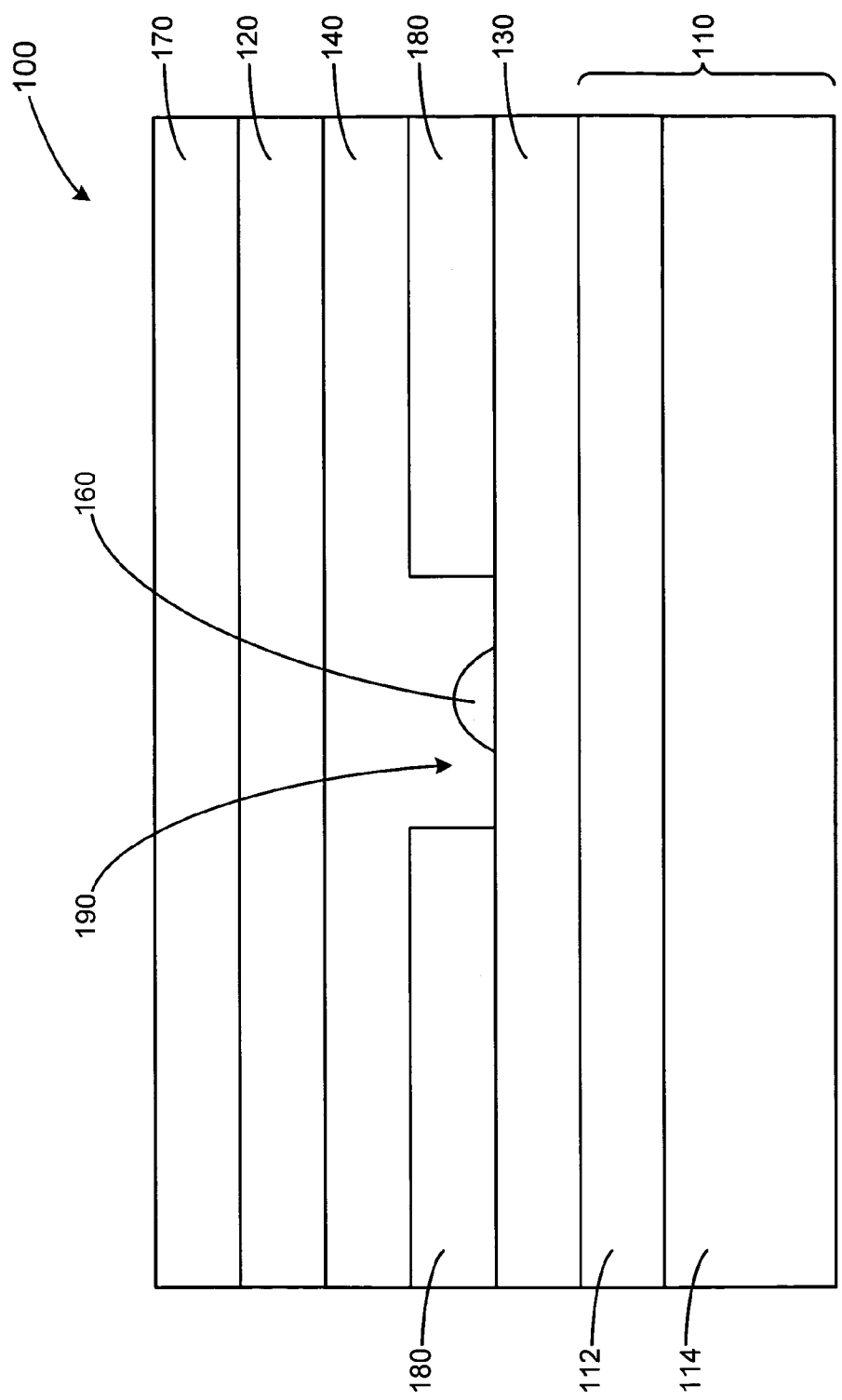
FIGS. 1 and 3-5 illustrate programmable structures formed on a surface of a substrate in accordance with embodiments of the present invention.

FIG. 1 illustrates a programmable microelectronic structure 100 formed on a surface of a substrate 110 in accordance with an exemplary embodiment of the present invention. Structure 100 includes electrodes 120 and 130, and an ion conductor 140. In addition, the structure may include various barrier layers and contacts, which are discussed below.

Generally, structure 100 is configured such that when a bias greater than a threshold voltage ($V_T$), discussed in more detail below, is applied across electrodes 120 and 130, the electrical properties of structure 100 change. For example, in accordance with one embodiment of the invention, as a voltage $V \geq V_T$ is applied across electrodes 120 and 130, conductive ions within ion conductor 140 begin to migrate and form a region 160 having an increased conductivity compared to the bulk ion conductor (e.g., an electrodeposit) at or near the more negative of electrodes 120 and 130. As region 160 forms, the resistance between electrodes 120 and 130 decreases, and other electrical properties may also change.

In the absence of any insulating barriers, which are discussed in more detail below, the threshold voltage required to grow the electrodeposit is approximately the potential at which oxidation of the anode and metal ion reduction at the cathode occurs, which is typically a few hundred millivolts. If the same voltage is applied in reverse, the electrodeposit will dissolve back into the ion conductor. In a similar fashion, an effective barrier height of a diode that forms between an ion conductor and an electrode can be reduced by growing region 160; thus current flow may be increased through the structure, even if the resistance of the structure is substantially the same.

Structure 100 may be used to store information and thus may be used in memory circuits. For example, structure 100 and other programmable structures in accordance with the present invention may suitably be used in memory devices to replace DRAM, SRAM, PROM, EPROM, EEPROM, combinations of such memory, and the like. In addition, programmable structures of the present invention may be used for other applications where programming or changing of electrical properties of a portion of an electrical circuit are desired.

In accordance with various embodiments of the invention, the volatility of programmable memory (e.g., cell 100) can be manipulated by altering an amount of energy (e.g., altering time, current, voltage, thermal energy, and/or the like) applied during a write process. In the case where region 160 forms during a write process, the greater the amount of energy (having a voltage greater than the threshold voltage for the write process) applied during the write process, the greater the growth of region 160 and hence the less volatile the memory. Conversely, relatively volatile, easily erased memory can be formed by supplying relatively little energy to the cell. Thus, relatively volatile memory can be formed using the same or similar structures used to form nonvolatile memory, and less energy can be used to form the volatile/easily erased memory. Use of less energy is particularly desirable in portable electronic devices that depend on stored energy for operation. The volatile and nonvolatile memory may be formed on the same substrate and partitioned or separated from each other such that each partition is dedicated to either volatile or nonvolatile memory; or, an array of memory cells may be configured as volatile or nonvolatile memory using programming techniques, such that the configuration (i.e., volatile or nonvolatile) of the memory can be altered by changing an amount of energy supplied during programming the respective portions of the memory array.

In a similar manner, a threshold voltage of a structure can be altered by manipulating an amount of conductive material within the ion conductor. The amount of conductive material may be altered by, for example, altering a charge applied to the structure or exposing the structure to photo and/or thermal energy sufficient to change the concentration of the metal within the ion conductor.

Referring again to FIG. 1, substrate 110 may include any suitable material. For example, substrate 110 may include semiconductive, conductive, semiinsulative, insulative material, or any combination of such materials. In accordance with one embodiment of the invention, substrate 110 includes an insulating material 112 and a portion 114 including a microelectronic devices formed using a portion of the substrate. Layer 112 and portion 114 may be separated by additional layers (not shown) such as, for example, layers typically used to form integrated circuits. Because the programmable structures can be formed over insulating or other materials, the programmable structures of the present invention are particularly well suited for applications where substrate (e.g., semiconductor material) space is a premium. In addition, forming a programmable structure overlying a microelectronic device may be advantageous because such a configuration allows greater data transfer between an array of programmable structures and the microelectronic device.

In accordance with one exemplary embodiment of the invention, one of electrodes 120 and 130 is formed of a material including a metal that dissolves in ion conductor 140 when a sufficient bias ($V \geq V_T$) is applied across the electrodes (an oxidizable or soluble electrode) and the other electrode is relatively inert and does not dissolve during operation of the programmable device (an inert or indifferent electrode). For example, electrode 120 may be an anode during a write process and be comprised of a material including silver that dissolves in ion conductor 140 and electrode 130 may be a cathode during the write process and be comprised of an inert material such as tungsten, nickel, molybdenum, platinum, metal silicides, and the like. Having at least one electrode formed of a material including a metal which dissolves in ion conductor 140 facilitates maintaining a desired dissolved metal concentration within ion conductor 140, which in turn facilitates rapid and stable region 160 formation within ion conductor 140 or other electrical property change during use of structure 100. Furthermore, use of an inert material for the other electrode (cathode during a write operation) facilitates electrodissolution of any region 160 that may have formed and/or return of the programmable device to an erased state after application of a sufficient voltage.

In accordance with one embodiment of the invention, at least one electrode 120 and 130 is formed of material suitable for use as an interconnect metal. For example, electrode 130 may form part of an interconnect structure within a semiconductor integrated circuit. In accordance with one aspect of this embodiment, electrode 130 is formed of a material that is substantially insoluble in material comprising ion conductor 140. Exemplary materials suitable for both interconnect and electrode 130 material include metals and compounds such as tungsten, nickel, molybdenum, platinum, metal silicides, and the like.

Ion conductor 140 is formed of material that conducts ions upon application of a sufficient voltage. Suitable materials for ion conductor 140 include glasses, plastics, and semiconductor materials. In general, ion conductors in accordance with the present invention can conduct ions without requiring a phase change, can conduct ions at a relatively low temperature (e.g., below 125° C.), can conduct ions at relatively low electrical currents, have a relatively high transport number, and exhibit relatively high ion conductivity. In one exemplary embodiment of the invention, ion conductor 140 is formed of chalcogenide material. However, other materials such as transition metal oxides (e.g., tungsten oxide or nickel oxide) may be used as an ion conductor in accordance with various embodiments of the invention.

Ion conductor 140 may also suitably include dissolved conductive material. For example, ion conductor 140 may comprise a solid solution that includes dissolved metals and/or metal ions. In accordance with one exemplary embodiment of the invention, conductor 140 includes metal and/or metal ions dissolved in chalcogenide glass. Exemplary chalcogenide glasses with dissolved metal in accordance with the present invention include solid solutions of $As_xS_{1-x}$—Ag, $As_xSe_{1-x}$—Ag, $As_xTe_{1-x}$—Ag, $Ge_xSe_{1-x}$—Ag, $Ge_xS_{1-x}$—Ag, $Ge_xTe_{1-x}$—Ag, $As_xS_{1-x}$—Cu, $As_xSe_{1-x}$—Cu, $As_xTe_{1-x}$—Cu, $Ge_xSe_{1-x}$—Cu, $Ge_xS_{1-x}$—Cu, and $Ge_xTe_{1-x}$—Cu where x ranges from about 0.1 to about 0.5, other chalcogenide materials including silver, copper, combinations of these materials, and the like. In addition, conductor 140 may include network modifiers that affect mobility of ions through conductor 140. For example, materials such as metals (e.g., silver), halogens, halides, or hydrogen may be added to conductor 140 to enhance ion mobility and thus increase erase/write speeds of the structure. Furthermore, ion conductor 140 may include a plurality of regions having different resistance values—for example, ion conductor 140 may include a first region proximate the oxidizable electrode having a relatively low resistance and a second region proximate the indifferent electrode having a relatively high resistance.

Figure 2:
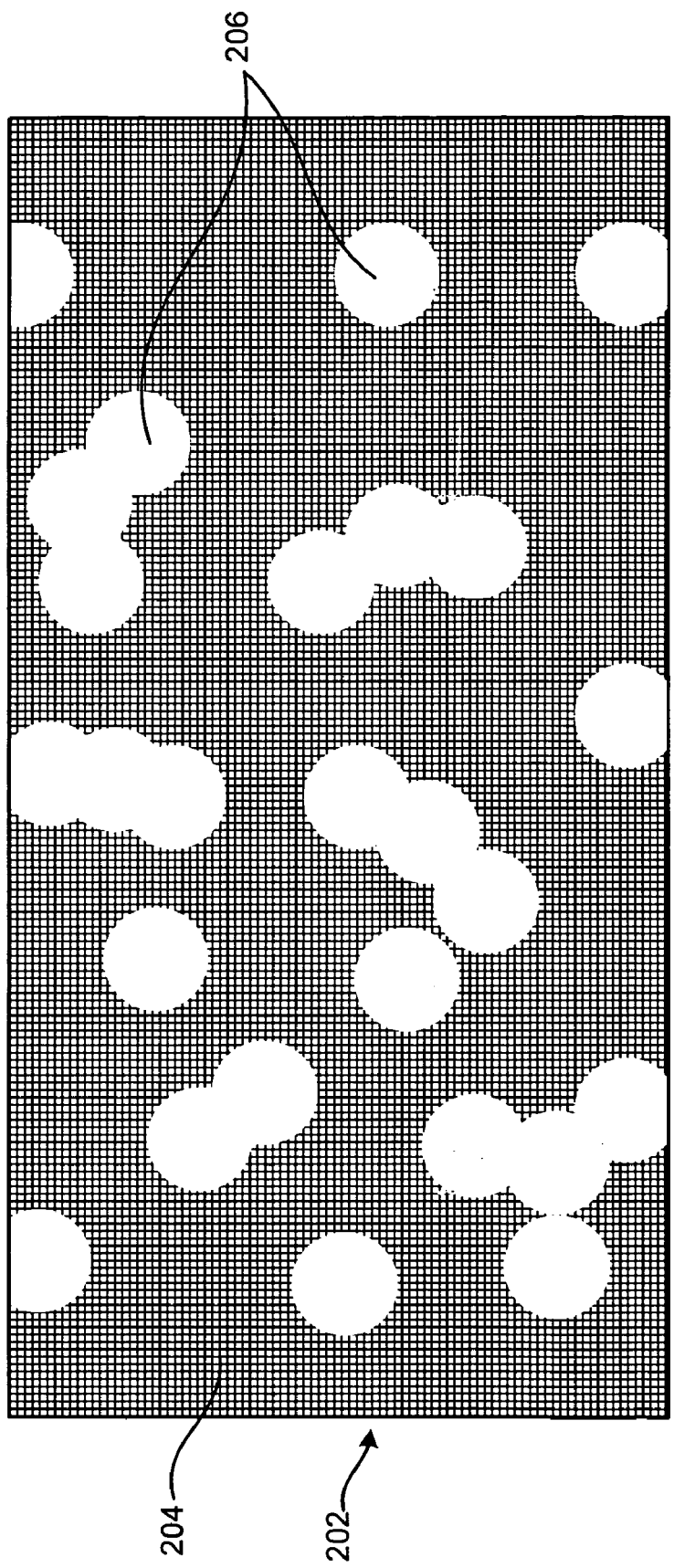
FIG. 2 illustrates a portion of a programmable structure in greater detail.

Referring again to FIG. 1, in accordance with various embodiments of the invention, the ion conductor includes phase-separated material. FIG. 2 illustrates a phase-separated ion conductor region 202, including a high-resistance portion 204 and low-resistance portions 206. By way of particular example, when ion conductor 202 includes silver doped $Ge_xSe_{1-x}$, where x is less than about 0.33 and preferably ranges from about 0.17 to about 0.3 and more preferably has a value of about 0.17 to about 0.25, ion conductor separates into a first phase 204 of Ge—Se (e.g., $Ge_2Se_3$) having a relatively high resistivity of greater than about $10^3$ ohm-cm and a second phase 206 of $Ag_2Se$, which is much more conductive that Ge—Se portion 204, having an ion resistivity of about 0.3 ohm-cm and an ion mobility of about $10^4$ cm²/V.s. In this case, phase-separated ion conductor 202 has an overall resistivity of about 100 ohm-cm and is stable at room temperature.

It is thought that phase-separated ion conductors facilitate large off resistance and high switching speed of programmable devices such as device 100. The reason for this is that the metal ions from the soluble electrode will migrate within region 204 to bridge low-resistance regions 206. Reduction of metal ions preferentially occurs in high-resistance regions 204 because the local field is highest in this area of ion conductor 202. This process is relatively fast because a typical gap between low-resistance portions is on the order of about 1 nm or less.

Other exemplary materials suitable for phase-separated ion-conductor material include silver and/or copper-doped germanium chalcogenides (e.g., sulfides and tellurides) and mixtures of these compounds, silver and/or copper-doped arsenic chalcogenides (e.g., selenides, sulfides, and tellurides) and mixtures of these compounds. Additional exemplary phase-separate ion conductors include $Ag_2Se$ dispersed within AgI or within an ion conductive polymer such as poly(ethylene oxide) and additional exemplary low-resistance material suitable for portion 204 includes $SiO_x$, $GeO_2$, and $Ag_2O$. It should be noted, however, that other ion conductor material that includes a low-resistance phase dispersed within a high-resistance phase will function in accordance with the present invention as described herein. Additional ion conductor materials and methods of forming the ion conductor are discussed in U.S. Pat. No. 6,635,914, entitled Microelectronic Programmable Device And Methods Of Forming And Programming The Same, issued to Kozicki et al. on Oct. 21, 2003, the content of which is incorporated herein by reference.

Contacts (e.g. contact 170) may suitably be electrically coupled to one or more electrodes 120, 130 to facilitate forming electrical contact to the respective electrode. The contacts may be formed of any conductive material and are preferably formed of a metal such as gold, aluminum, aluminum alloys, tungsten, or copper.

Structure 100 also includes insulating material 180 to isolate the electrodes from each other. In accordance with various embodiments of the invention, material 180 includes electron-beam sensitive material such as polymethylmethacrylate (PMMA) or calixerene. In accordance with other embodiments, material 180 includes insulating or dielectric material such as silicon oxide. In accordance with yet other embodiments of the invention, an opening 190 within material 180 is less than 200 nm and preferably less than 100 nm. The width of the opening within material 180 defines the active region of the device because the electrodeposition and therefore the conductive region growth occurs within the ion conductor within the via.

Figure 3:
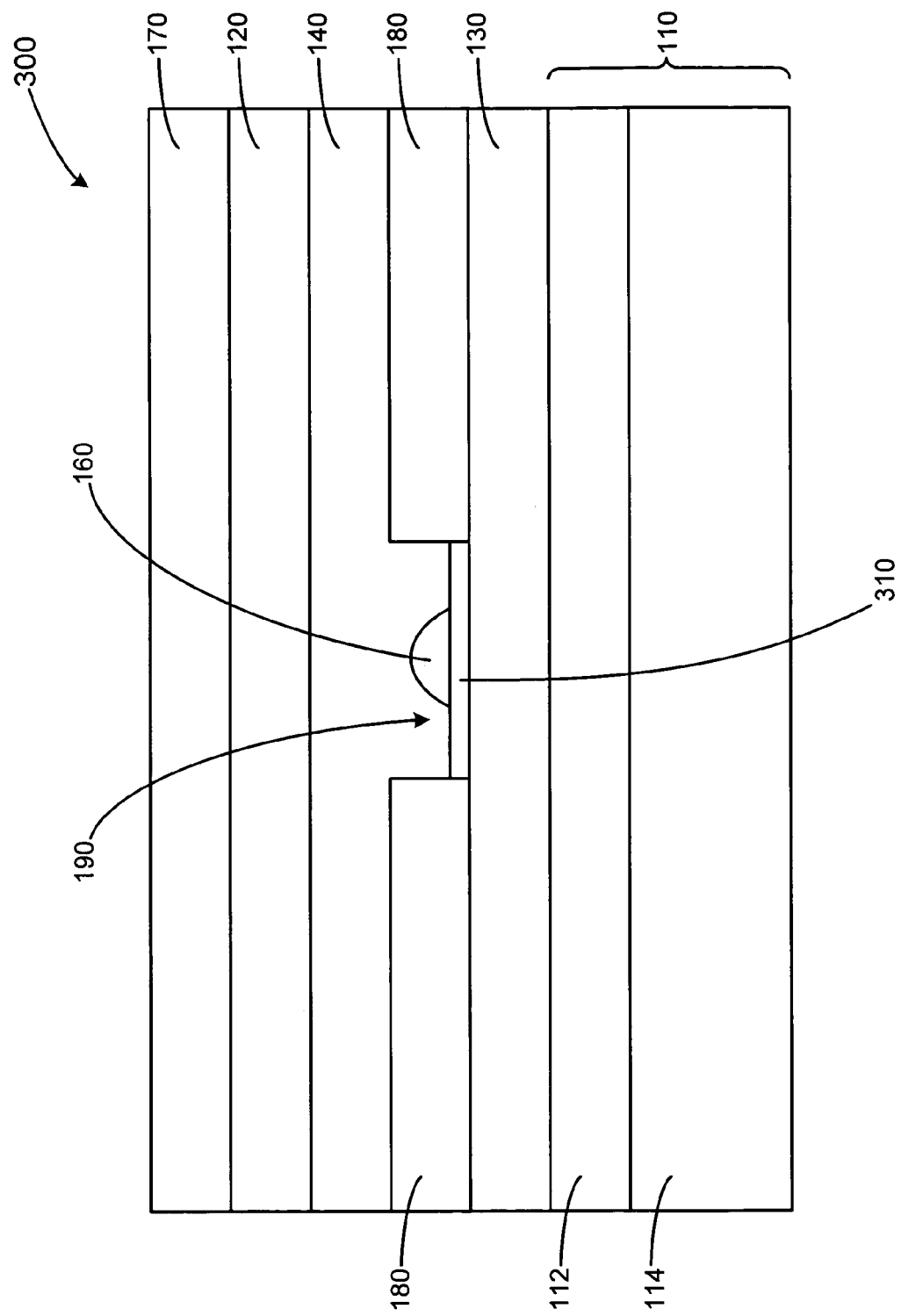
Figure 4:
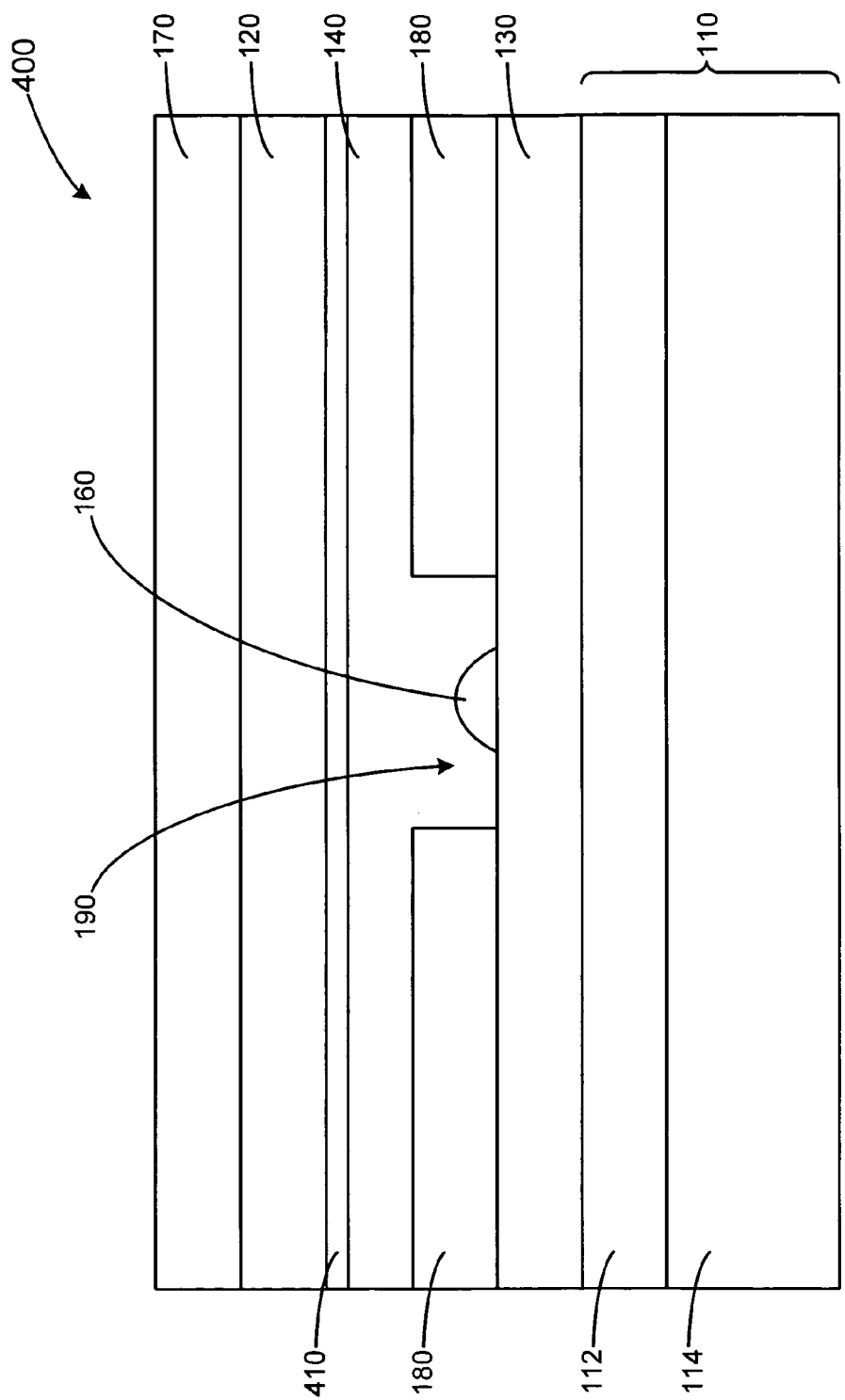

FIGS. 3-4 illustrate additional structures 300 and 400 in accordance with additional embodiments of the invention. Structure 300 is similar to structure 100, except structure 300 includes a barrier layer 310 between electrode 130 and ion conductor 140. Likewise, structure 400 is similar to structure 100, except structure 400 includes a barrier layer 410 between ion conductor 140 and electrode 120.

Barrier layers 310 and 410 may be insulating or conducting and may be formed of a variety of materials. For example, barrier layers 310 and/or 410 may include a material that restricts migration of ions between conductor 140 and the electrodes and/or that affects the threshold voltage required to form the electrodeposit. In accordance with exemplary embodiments of the invention, a barrier layer includes conducting material such as titanium nitride, titanium tungsten, a combination thereof, or the like. Use of a conducting barrier allows for the inert electrode to be formed of oxidizable material because the barrier prevents diffusion of the electrode material to the ion conductor. In accordance with yet other exemplary embodiments of the invention, the barrier includes material that conducts ions, but which is relatively resistant to the conduction of electrons. Use of such material may reduce undesired plating at an electrode and increase the thermal stability of the device. In the case of insulating materials, the barrier layer can be used to increase a voltage required to reduce the resistance of the device.

Although the structures are separately illustrated with barrier layers associated with only one electrode, devices and structures of the invention may include two or more barrier layers. For example, a barrier may be present between electrode 120 and ion conductor 140 and between electrode 130 and ion conductor 140.

Figure 5:
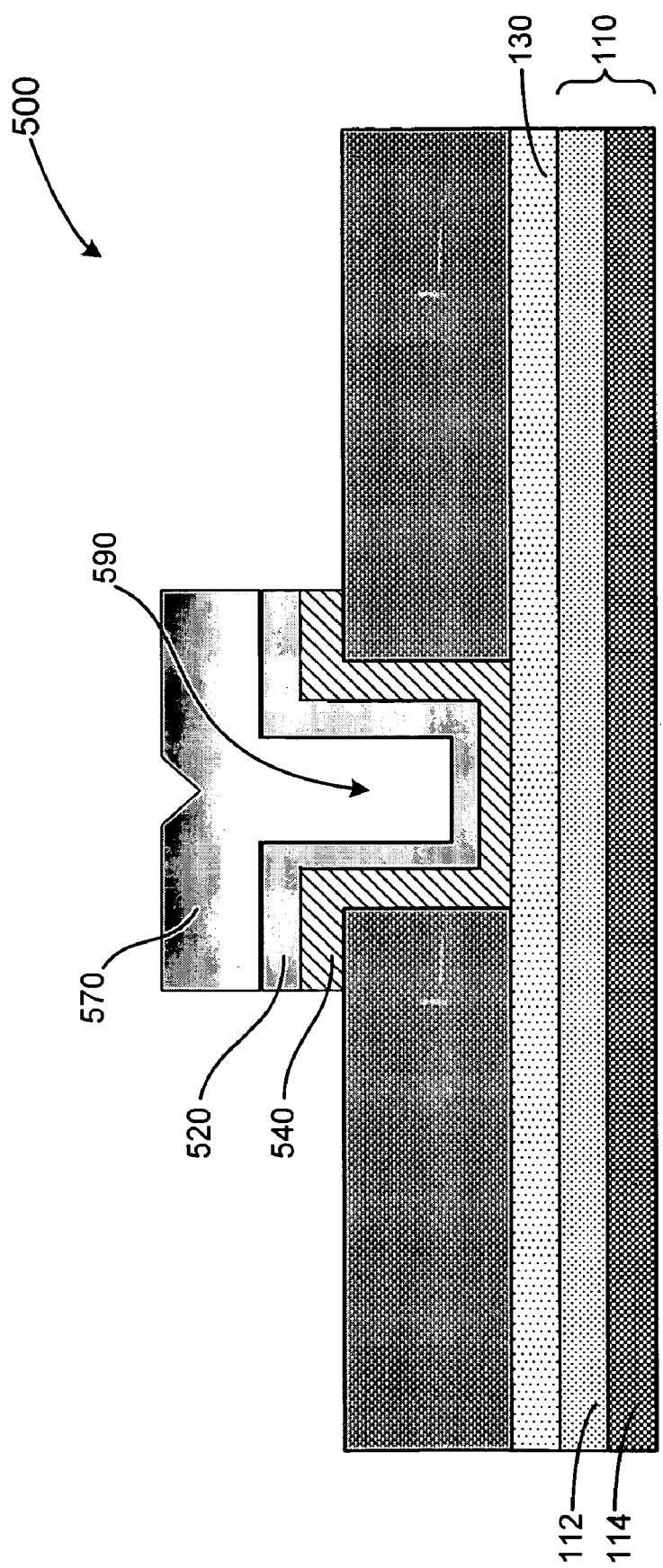

FIG. 5 illustrates yet another programmable structure 500 in accordance with the present invention. Structure 500 is similar to structure 100, except structure 500 includes ion conductor 540 which only partially fills a via 590. Electrode 520 and contact 590 overly ion conductor 540 and may similarly partially fill via 590.

Method of Forming the Programmable Structures

Referring again to FIG. 1, in accordance with one exemplary embodiment of the invention, a device in accordance with the present invention may be formed as follows. Initially insulating material such as silicon oxide is grown or deposited onto a substrate such as a silicon wafer. First electrode material is then deposited onto the insulating material, patterned and etched. Next, a second insulating material is deposited onto the first insulating material and the first electrode. Vias are formed within the second insulating material, and ion conductor material is deposited into the vias and onto the first electrode. Second electrode material and optionally contact material are then deposited over the ion conductor and these layers are patterned and etched.

The following non-limiting examples illustrate exemplary methods of forming programming structures in accordance with various embodiments of the invention. These examples are merely illustrative, and it is not intended that the invention be limited to these examples.

EXAMPLE I

A 100 nm thick silicon oxide layer is grown on a silicon substrate. Next, a first electrode material (e.g., 100-200 nm of Ni) is deposited onto the silicon oxide. The first electrode material is patterned (e.g., using optical lithography) to form the bottom inert electrodes. Immediately following first electrode material patterning (to avoid significant ambient surface contamination of the material), electron-beam resist (e.g., 100 nm of PMMA) is deposited over the silicon oxide and first electrode material. The resist is applied by spin casting and the resist is baked at 170° C. for about 18 hours to ensure complete solvent removal. The insulting material is then patterned by exposing the PMMA using a JEOL 6000 e-beam lithography system having an area dose of 1200 $\mu C/cm^2$ to define nanoscale openings aligned to the bottom electrode. The resist is then developed by exposing the patterned resist for 20 seconds in a developer including 11:10:1 MIBK:CS:MEK (MIBK is 1:3 methyl isobutyl ketone:isopropanol, CS is 3:7 2-ethoxyethanol:methanol, MEK is 2.65:7.35 methyl ethyl ketone:ethanol) followed by a 30 second isopropyl alcohol (IPA) rinse. Such conditions lead to high-resolution patterns in the PMMA with steep sidewalls.

Following development, approximately 50 nm of base glass is evaporated from a $Ge_{30}Se_{70}$ source under high vacuum ($10^{-6}$ Torr) conditions using a resistively heated Knudsen-type cell. This approach helps to ensure that the composition of the deposited film is close to that of the source material. A low deposition rate of about 0.01 to about 0.1, and preferably about 0.03 nm/sec facilitates good step coverage/fill in the narrow vias.

Following the deposition of the $Ge_{30}Se_{70}$ and without breaking vacuum, 30 nm of Ag is evaporated onto the ion conductor. This thickness combination ensures complete saturation of the glass with Ag throughout its depth and leaves a thin residual surface silver layer, approximately 10 nm thick, when the dissolution is driven to completion. For silver diffusion, a 0.35 $W/cm^2$ incandescent (tungsten) broad spectrum source provides both heat and light for the dissolution of the silver into the base glass. The exposure is performed under high vacuum for about 70 minutes to avoid oxidation of the electrolyte layer. The approximate steady state substrate temperature during this step, as measured by a temperature sensor in contact with the sample back, is about 100° C., considerably below the glass transition temperatures of any materials present (note that the $T_g$ of thin film PMMA is around 120° C.).

The second electrode material is then formed overlying the ion conductor layer by depositing (e.g., by evaporation) an additional 100 nm of Ag, preferably without breaking vacuum.

The ion conductor and the second electrode structures are then formed by depositing (e.g., using a spin-on technique) a layer of optical photoresist, patterning the photoresist using a standard optical aligner developing the patterned resist to define the electrolyte and the second electrode area, and etching the layers in ferric nitrate solution (3 g Fe(NO$_3$)$_3$.9H$_2$O in 50 ml DI water). The resist is then stripped to complete the device structure.

Using this technique, the vias in the PMMA have near-vertical sidewalls and the deposition conditions for the electrolyte (e.g., $Ag_{33}Ge_{20}Se_{47}$) fill the narrow openings.

EXAMPLE II

This process is the same as the process of Example I, with the exception of the electron beam parameters, the Ag dissolution is performed using UV light only, and a gold top electrode is added to prevent tarnishing of the silver.

Following the deposition of the PMMA, the PMMA is exposed at 800 $\mu C/cm^2$ using the JEOL 6000 EBL system and the patterns are developed described above. Approximately 50 nm of $Ge_{30}Se_{70}$ in then evaporated at 0.05 nm/sec along with a 30 nm thick Ag overlayer and the Ag is diffused by exposing the metal to 405 nm UV radiation at an energy of 1 $J/cm^2$ to ensure Ag penetration throughout the entire thickness of the electrolyte film. A top electrode bilayer of 80 nm of Ag and 50 nm of Au is then deposited. This stack is then patterned using optical lithography and a combination of sputter etching (to pattern the Au) and wet etching as described above.

Methods of Programming and Using the Device and Structure

As noted above, information may be stored using programmable structures of the present invention by manipulating one or more electrical properties of the structures. For example, a resistance of a structure may be changed from a "0" or off state to a "1" or on state during a suitable write operation by growing electrodeposit 160. Similarly, the device may be changed from a "1" state to a "0" state during an erase operation by dissolving the electrodeposit.

Referring again to FIGS. 1 and 3-5, as in any electrochemical system, the size of electrodeposit 160 is a function of the magnitude and duration of the Faradaic current. Since the reduction and simultaneous oxidation will only take place when the voltage across the device is above a critical threshold, determined by the materials in the device stack, the on resistance can be set by a current limit. In this case, the decreasing resistance due to the electrodeposition effect increases the current flowing through the device until the current limit is reached, at which point the voltage drop falls to the threshold and the electrodeposition stops. For a device made in accordance with Example I, this threshold changes during switching, starting in an unwritten/erased device in our case around 200 mV but dropping to just below 100 mV once the electrodeposition process has been initiated. The on resistance is determined by this latter threshold divided by the programming current limit so that a 10 $\mu A$ programming current leads to an on state having a resistance on the order of $10^4$ $\Omega$ and about 1 mA for a state nearer to 100 $\Omega$. So, in a sub-100 nm device made from a fully saturated electrolyte with a resistivity of 100 $\Omega.cm$, the off resistance will be on the order of $10^7$-$10^8$ $\Omega$ (depending on the via width and the electrolyte thickness) and the on resistance will be many orders of magnitude below this, depending on the programming current used.

In addition, the concentration of conductive material in the ion conductor, in general, can be controlled by applying a bias across the programmable device. For example, metal such as silver may be taken out of solution by applying a negative voltage in excess of the reduction potential of the conductive material. Conversely, conductive material may be added to the ion conductor (from one of the electrodes) by applying a bias in excess of the oxidation potential of the material. Thus, for example, if the conductive material concentration is above that desired for a particular device application, the concentration can be reduced by reverse biasing the device to reduce the concentration of the conductive material. Similarly, metal may be added to the solution from the oxidizable electrode by applying a sufficient forward bias. Additionally, it is possible to remove excess metal build up at the indifferent electrode by applying a reverse bias for an extended time or an extended bias over that required to erase the device under normal operating conditions. Control of the conductive material may be accomplished automatically using a suitable microprocessor.

A partial write or a partial erase caused by a forward or reverse programming pulse of insufficient duration and/or current to introduce enough silver to significantly reduce the resistance of the high-resistance regions will cause additional silver to migrate from the soluble electrode the high-resistance portions. The conductivity and activation energy in these zones are altered by this excess silver even though the device will appear to be in a high resistance state. The change in activation energy results in higher ion mobility and hence this partial preprogramming results in much faster switching than in a device which had been fully written or erased, which in turn allows appropriately scaled devices to operate at SRAM speeds (in the nanosecond or less range).

In addition, in a written device that has "faded" due to thermal diffusion of the electrodeposited material away from the low resistance pathway, the local excess silver will still promote a lower activation energy but in this case, there is also sufficient silver present such that the voltage required to reform the conducting link will be lower than in the case of a normal write. The "reclosure" voltage will be several tens of mV lower than the redox potential of the system since the silver required to close the link is already in the material and does not have to be released from the oxidizable electrode. This means that a simple "read" operation involving a short pulse below the redox potential will be sufficient to regenerate a faded on-state in the device but will be insufficient to disturb a device that has been fully erased (and hence does not have the excess silver). This will allow faded lightly written (low programming current) states to be automatically regenerated by the read operation, thereby extending the effective retention of the devices.

This technique may also be used to form one of the electrodes from material within the ion conductor material. For example, silver from the ion conductor may be plated out to form the oxidizable electrode. This allows the oxidizable electrode to be formed after the device is fully formed and thus mitigates problems associated with conductive material diffusing from the oxidizable electrode during manufacturing of the device.

The threshold voltage of programmable devices may also be manipulated in accordance with various embodiments of the present invention. One way to manipulate the electrodeposition threshold voltage is to manipulate the conductive material dispersed within the ion conductor material. Another technique for manipulating the threshold voltage is to alter an amount of oxidizable material at or near the indifferent electrode. In this case, the oxidizable metal at the cathode can be altered by first forming an electrodeposit at or near the indifferent electrode and then applying a reverse bias sufficient to dissolve a portion of the electrodeposit. The threshold voltage generally goes down as the amount of oxidizable metal at the cathode goes up. Alternatively, a write process may be used to form a desired electrodeposit at or near the cathode. This electrochemical control of the threshold voltage can be used to heal or regenerate an electrodeposit that has been thermally or electrochemically damaged or redistributed. As an example of how this works, consider the following:

1. An electrodeposit can be formed in or on the electrolyte using a write voltage that is determined by the Ag concentration near the cathode.

2. A read voltage below the write voltage may be used to determine the state of the device without disturbing an off device.

3. The electrodeposit is subsequently "damaged" by thermal diffusion (e.g., excessive external device heating) so that the electrodeposit is no longer continuous or localized.

4. The Ag concentration near the cathode will still be higher than in the case of an unwritten or completely erased device as the silver cannot diffuse against the diffusion gradient.

5. The increased cathodic silver results in a reduction of the re-write voltage, e.g., below the read voltage which is chosen not to disturb an off state but to be high enough to "regenerate" most failed electrodeposits.

Therefore, a read operation can be used to automatically re-electrodeposit the silver and regenerate the data state stored in the device via the electrodeposited material. This will ensure that the programmable structures effectively retain data for extended periods of time.

FIGS. 6-11 illustrate the performance of various devices formed in accordance with various embodiments of the invention.

Figure 6:
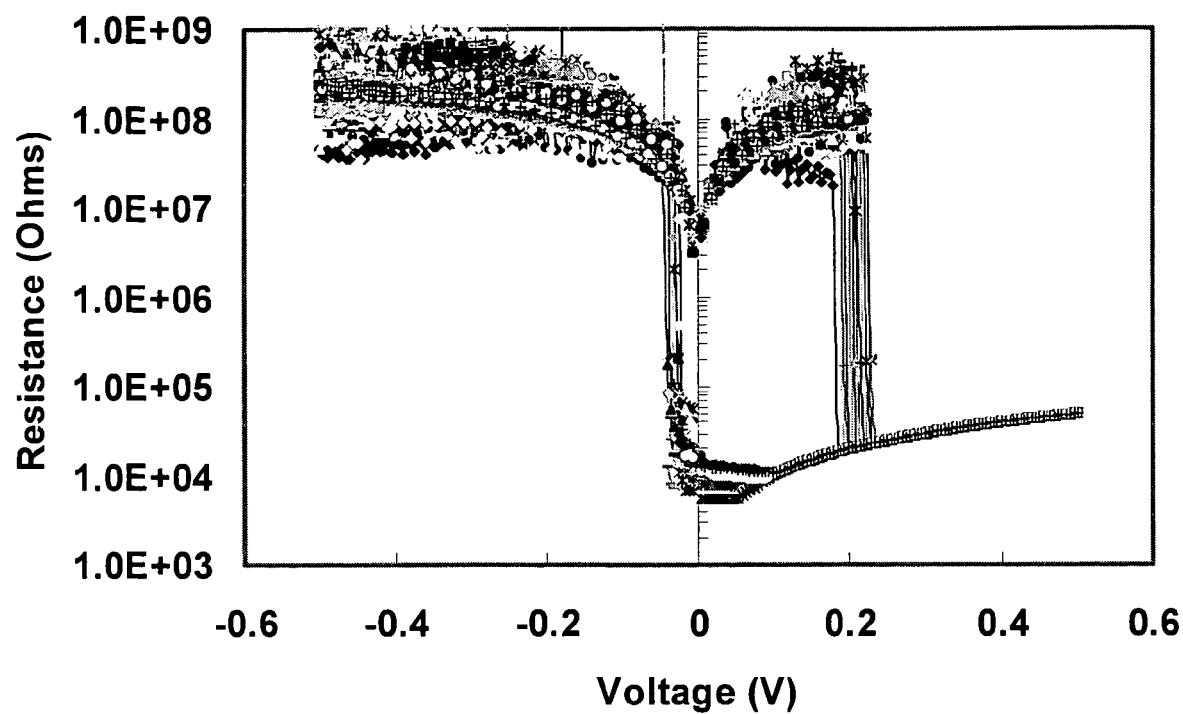
FIGS. 6-11 illustrate various performance characteristics of programmable structures of the present invention.
Figure 7:
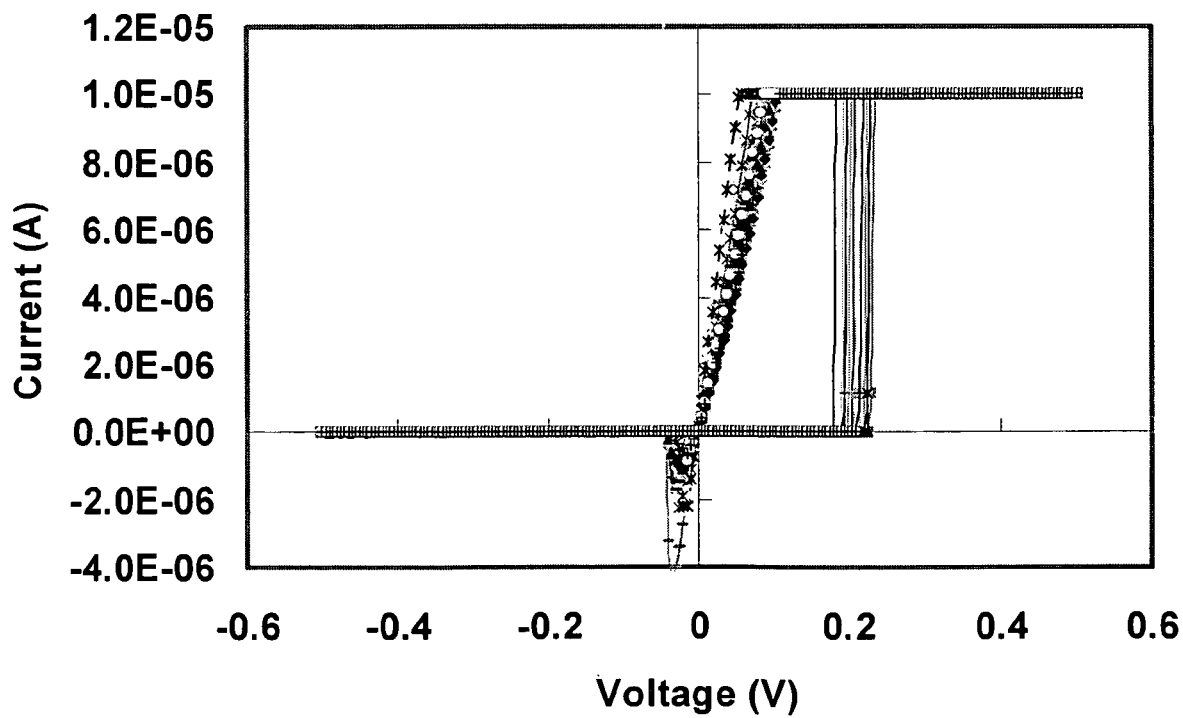

FIG. 6 illustrates a resistance-voltage plot and FIG. 7 illustrates a current-voltage plot for 32 double sweeps on a programmable structure formed according to Example I described above and having a PMMA via width of about D=75 nm. Each sweep runs from −0.5 V to +0.5 V to −0.5 V and the current limit is 10 µA. For this device, the off resistance for forward bias is in the $10^7$-$10^8$ Ω range. Variation in the data is thought to be due to overwriting the structures, which results in excess electrodeposited Ag (more than is necessary to switch the device); this makes the devices more difficult to erase and leads to varying amounts of Ag in the electrolyte which will influence the off resistance. Such variation is not evident during faster cycling (see below). The device switches to its low resistance state around 0.2 V, at which point the current reaches its compliance limit of 10 µA. The current stays at the compliance limit until the negative-going sweep reaches approximately 0.1 V, at which point the measured on resistance is about $10^4$ Ω, around 3-4 orders of magnitude lower than the off state. Note that the apparent rise in resistance between 0.1 and 0.5 V is an artifact of the current compliance control in the measurement instrument. The appearance of the lower threshold following switching represents the minimum voltage required for electrodeposition once the process has been initiated and a metal-rich region has formed in the electrolyte (or more specifically on the cathode). Electrodeposition within the electrolyte will continue as long as the voltage drop is greater than 0.1 V for this physical configuration. The device transitions to its high resistance state around −0.04 V but is not actually erased at this point as it will switch back to its low resistance state at an applied bias closer to 0.1 V rather than at the 0.2 V necessary to write a fully erased device. In the illustrated case, to fully erase the device, the reverse bias must be less than about −0.5V. The sudden increase in resistance at low voltage is thought to be due to the initial breaking of the conducting pathway, leading to a device resistance that is dominated by the high resistivity of a small portion of unbridged electrolyte. However, at this point, there is still part of an electrodeposited pathway present, albeit incomplete, and this allows reclosure at the lower threshold. A device that has been fully erased at about −0.5 V has very little or none of this residual electrodeposit left and so requires about 0.2 V to rewrite. This is useful in the context of noise immunity in that a "read" voltage of about 0.15 V is insufficient to switch a fully erased device but will reclose a device that was initially on but had been put in a "soft erase" state by a low (negative) voltage unintended disturb event.

FIG. 7 illustrates a current-voltage plot from a programmable structure having a PMMA via width of about D=40 nm made using the process described above in connection with Example II. At smaller via widths, the process of Example II produced less vertical sidewalls, which is thought to mitigate via fill issues. The plot of FIG. 7 contains 6 consecutive voltage sweeps from −0.6 to +0.6 to −0.6 V and a 1 mA write current limit was used to drive the device to a low resistance on state around 150 Ω from an off state in the $10^7$ Ω range. The write threshold is around 0.2 V as before but the erase initiation (the point at which the pathway breaks) is around −0.1 V for this more "robust" electrodeposit. The above results demonstrate the low voltage and low power switching and large off/on ratios of the nanoscale programmable structure and devices of the present invention.

Figure 8:
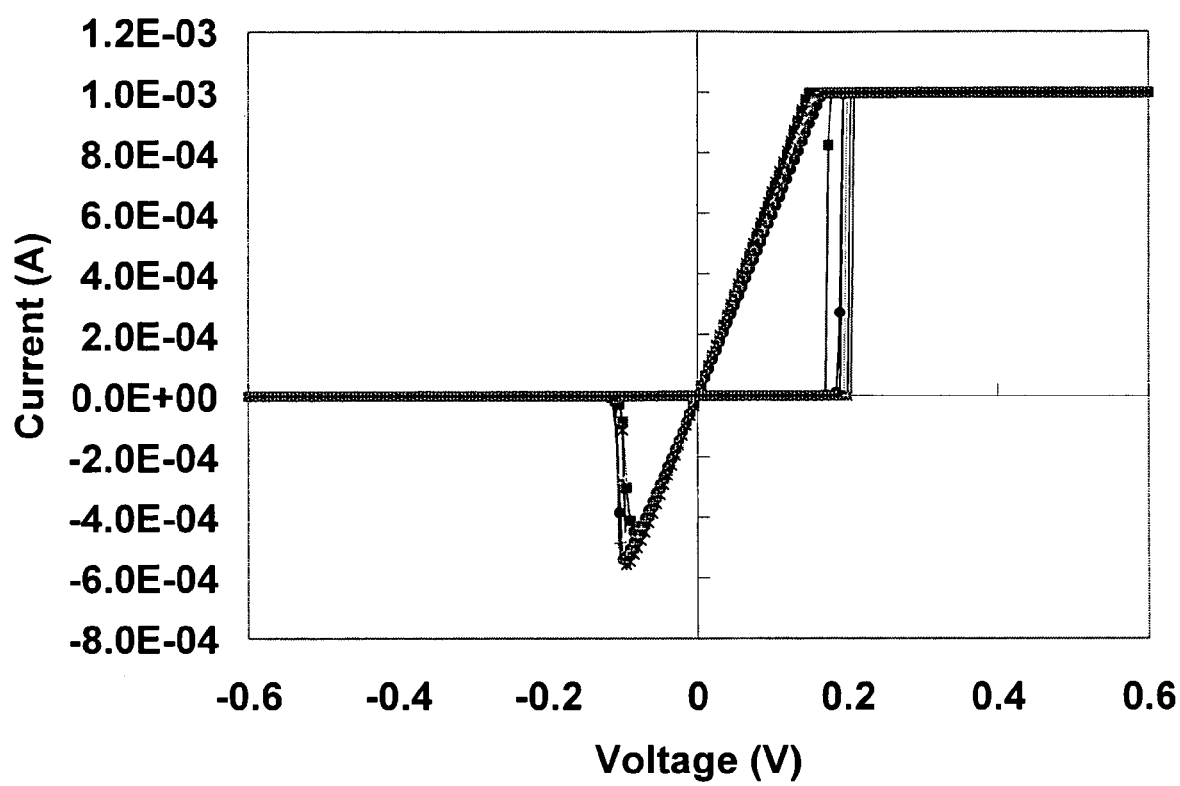

FIG. 8 illustrates cycling and endurance results of a device having a PMMA via width of about 75 nm formed in accordance with Example I above. In the illustrated case, the input signal is supplied by a waveform generator and the output, the voltage drop across a $10^4$ Ω resistor in series with the device under test, is measured along with the input signal using a digital storage oscilloscope. Unfortunately, this type of set up severely limits the frequency of operation due to the considerable inherent parasitics, especially capacitance which is in the pF range (mostly due to the probe pads and connecting cables). However, this set up does allow cycling testing of the devices, although input voltages higher than those used in the quasi-static case are required to overcome the effects of the circuit parasitics.

Figure 9:
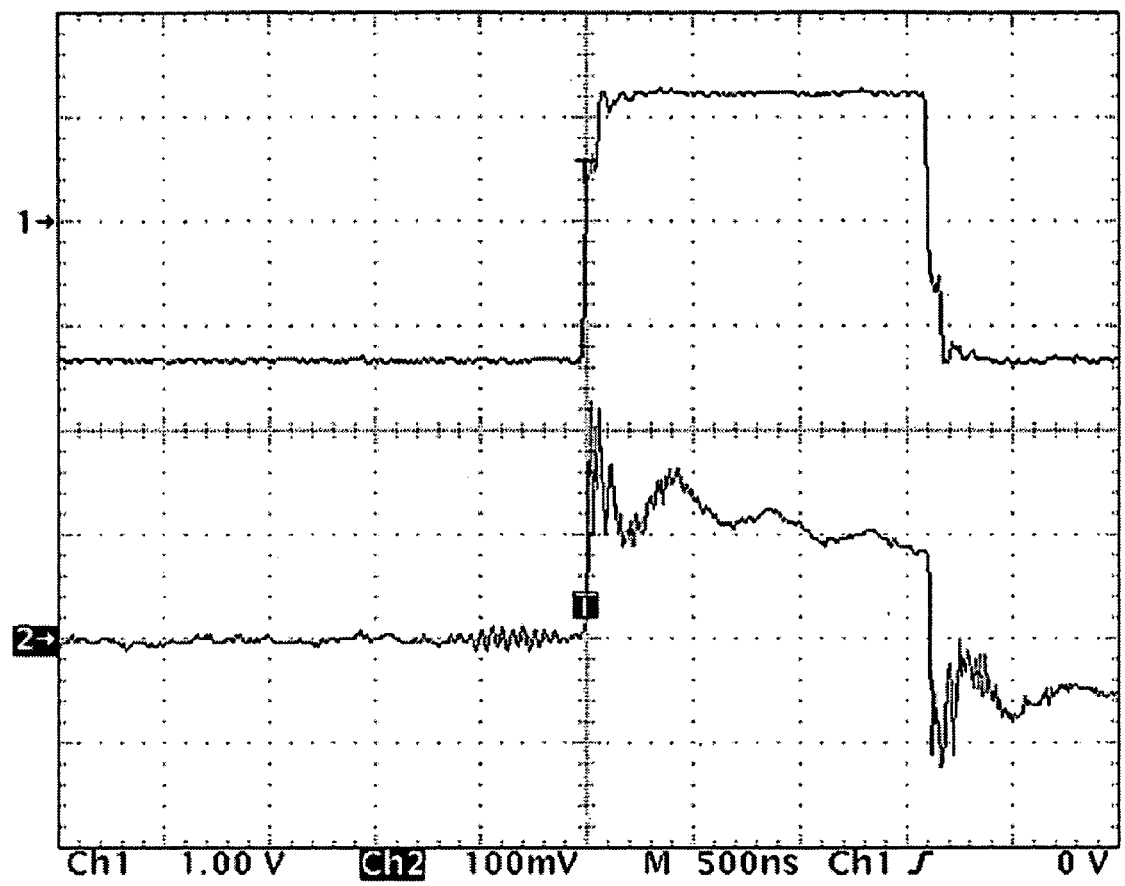

FIG. 9 illustrates a device output (lower waveform), initially in the off state coupled to an input signal (upper waveform) which goes from −1.3 V to +1.2 V in 70 nsec and 1.6 µsec later drops in 70 nsec back to −1.3 V. As indicated by the lower waveform, the device switches to the on state within the rise time of the signal, as shown by the rise in test circuit current from its near zero value. The transition to the high resistance state during the negative going portion of the input signal occurs within the negative transition of the input.

For cycling, trains of positive (write) pulses of 1.2 V in magnitude and 1.6 µsec duration followed by −1.3 V negative (erase) pulses 8.7 µsec long were applied to the same structure. This duty cycle was selected because of a time constant of several µsec in the test circuit when the device is in its high resistance off state.

Figure 10:
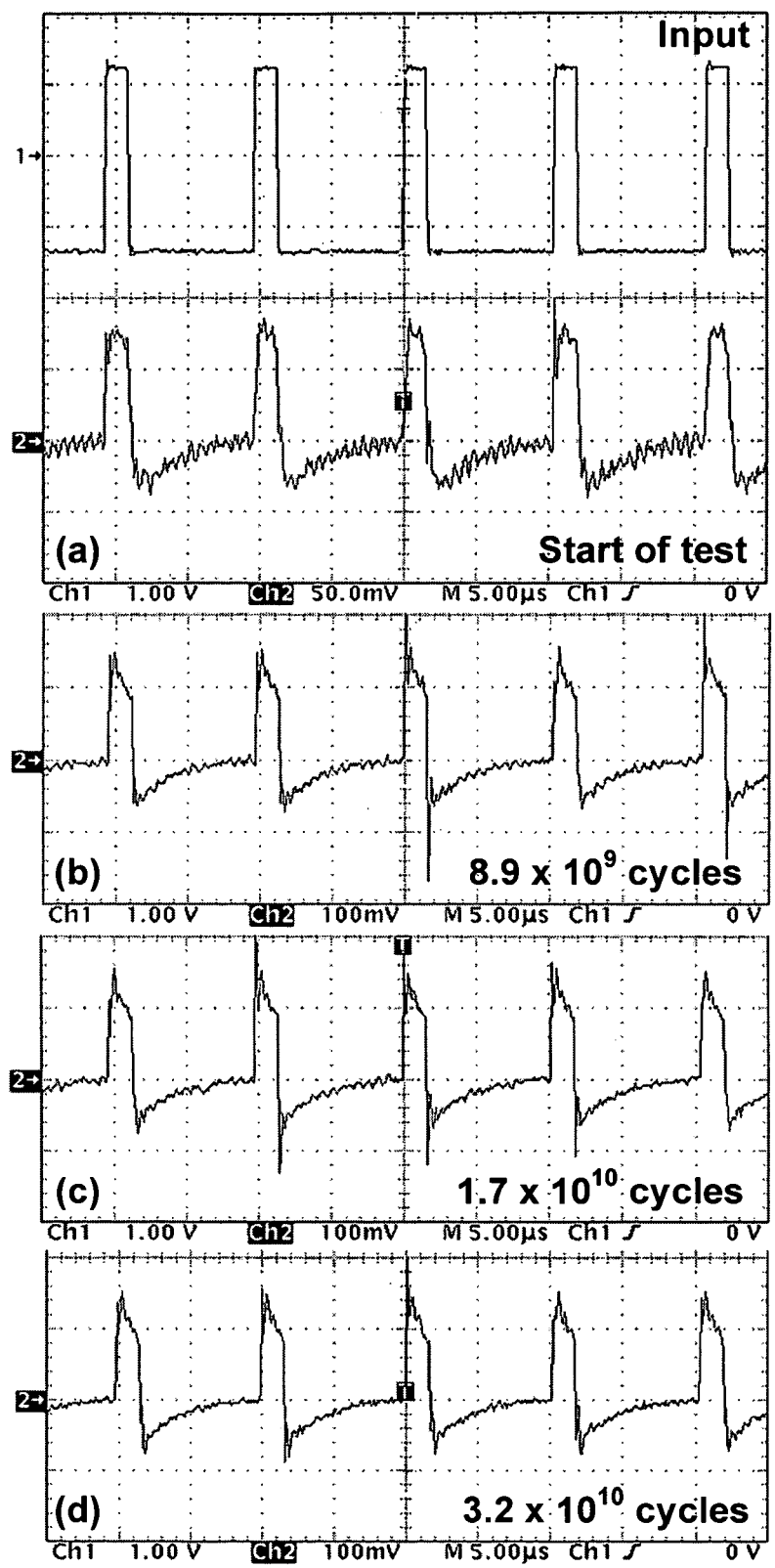

FIGS. 10(a)-10(d) illustrate a sequence of output waveforms taken at various numbers of cycles—at the start of the test (FIG. 10(a)) and at three points in time around $10^{10}$ cycles apart (FIGS. 10(b)-10(d)). The output waveforms, again the measured voltage across a $10^4$ Ω series resistor, show the device switching during the rise in magnitude of the input signal as determined by the change in test circuit current. The waveform during early cycling appears different from those close to $10^{10}$ cycles and above (note that the vertical scale on the lower waveform of FIG. 10(a) is 50 mV whereas it is 100 mV in the lower waveforms of FIGS. 10(b)-10(d)). The test circuit current in the on state, averaged over 5 cycles, is around 8 μA and the maximum averaged current at the off transition is around 3.5 μA. This compares with over 12 μA and 6 μA for maximum on and off transition currents respectively for higher numbers of cycles. This could be due to a "balancing" process, whereby an equilibrium concentration of Ag is reached in the electrolyte during the initial write-erase operations. The maximum test circuit current when this quasi-equilibrium is reached is slightly over 12 μA and thereby indicates a total test circuit resistance around $10^5$ Ω. As shown, the transition to the off state on the negative going edge of the input signal is indicated by the sudden drop in current and subsequent high frequency ringing. Following this, the voltage and therefore the test circuit current decays exponentially from its maximum around 6 μA to zero during the duration of this negative pulse. The slow decay is due to the parasitic capacitance, as mentioned before. FIGS. 10(*b*)-10(*d*) show little difference in the output waveforms between $8.9 \times 10^9$ and $3.2 \times 10^{10}$ cycles but careful analysis shows that there actually is a slight drop in the test circuit current with the number of cycles.

Figure 11:
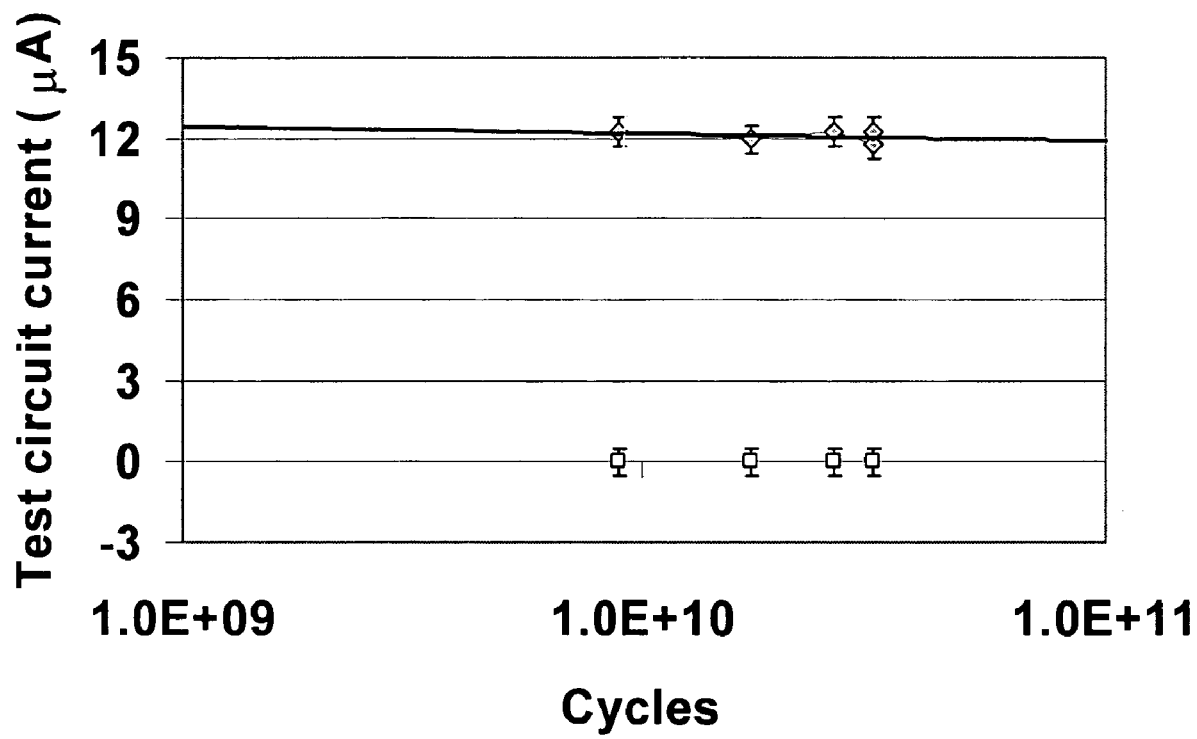

FIG. 11 illustrates the average (over 5 cycles) test circuit on current and minimum off current following decay in the $10^9$ to $10^{11}$ cycles range for the same device. This Figure illustrates the devices can be cycled well beyond the $10^{11}$ write-erase cycles; if the observed logarithmic behavior is maintained, there will only be a 20% decrease in on current at $10^{16}$ cycles.

Although the present invention is set forth herein in the context of the appended drawing figures, it should be appreciated that the invention is not limited to the specific form shown. For example, while the programmable structures are conveniently described above in connection with chalcogenide ion conductors, the invention is not so limited. Furthermore, although the devices are illustrated as including various buffer or barrier layers, such layers are not required to practice the invention. Various other modifications, variations, and enhancements in the design and arrangement of the method and apparatus set forth herein, may be made without departing from the spirit and scope of the present invention as set forth in the appended claims.

What is claimed is:

1. A microelectronic programmable structure comprising:
   an insulating material having a via width of less than about 200 nm;
   an ion conductor comprising conductive material formed within a portion of the via;
   an oxidizable electrode proximate the ion conductor;
   a barrier layer between the oxidizable electrode and the indifferent electrode; and
   an indifferent electrode proximate the ion conductor.

2. The microelectronic programmable structure of claim 1, wherein the ion conductor comprises a material selected from the group consisting of sulfur, selenium, and tellurium, and oxygen.

3. The microelectronic programmable structure of claim 1, wherein the ion conductor comprises a material selected from the group consisting of $GeO_2$, $Ag_2O$, $Cu_{(1,2)}O$, $SiO_2$, $Ge_xS_{1-x}$, $As_xS_{1-x}$, $Ge_xSe_{1-x}$, $As_xSe_{1-x}$, $Ge_xTe_{1-x}$, $As_xTe_{1-x}$, $NiO_x$, and $WO_x$.

4. The microelectronic programmable structure of claim 1, wherein the insulating material comprises electron-beam resist material.

5. The microelectronic programmable structure of claim 1, wherein the insulating material comprises a material selected from the group consisting of polymethylmethacrylate and calixerene.

6. The microelectronic programmable structure of claim 1, wherein the via width is less than about 100 nm.

7. A microelectronic programmable structure comprising:
   an insulating material comprising electron-beam resist material and having a via;
   an ion conductor comprising conductive material formed within a portion of the via;
   an oxidizable electrode proximate the ion conductor; and
   an indifferent electrode proximate the ion conductor.

8. The microelectronic programmable structure of claim 7, wherein the ion conductor comprises a material selected from the group consisting of sulfur, selenium, and tellurium, and oxygen.

9. The microelectronic programmable structure of claim 7, wherein the ion conductor comprises a material selected from the group consisting of $GeO_2$, $Ag_2O$, $Cu_{(1,2)}O$, $SiO_2$, $Ge_xS_{1-x}$, $As_xS_{1-x}$, $GexSe_{1-x}$, $As_xSe_{1-x}$, $Ge_xTe_{1-x}$, $As_xTe_{1-x}$, $NiO_x$, and $WO_x$.

10. The microelectronic programmable structure of claim 7, wherein the via is less than about 200 nm.

11. The microelectronic programmable structure of claim 7, wherein the insulating material comprises a material selected from the group consisting of polymethylmethacrylate and calixerene.

12. The microelectronic programmable structure of claim 7, wherein the via width is less than about 100 nm.

13. A microelectronic programmable structure comprising:
   an insulating material having a via width of less than about 200 nm;
   an ion conductor comprising conductive material formed within a portion of the via;
   an oxidizable electrode proximate the ion conductor; and
   an indifferent electrode proximate the ion conductor,
   wherein the insulating material comprises electron-beam resist material.

* * * * *